US006479864B1

(12) United States Patent
Ko

(10) Patent No.: US 6,479,864 B1
(45) Date of Patent: Nov. 12, 2002

(54) SEMICONDUCTOR STRUCTURE HAVING A PLURALITY OF GATE STACKS

(75) Inventor: Kei-Yu Ko, Meridian, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/577,390

(22) Filed: May 25, 2000

Related U.S. Application Data

(60) Division of application No. 08/958,290, filed on Oct. 27, 1997, which is a continuation-in-part of application No. 08/846,671, filed on Apr. 30, 1997.

(51) Int. Cl.[7] .......................... H01L 27/01; H01L 27/12; H01L 31/0392
(52) U.S. Cl. ......................... 257/347; 257/67; 257/368; 257/401
(58) Field of Search ................. 257/347, 350, 257/351, 368, 401, 67, 68, 69, 70

(56) References Cited

U.S. PATENT DOCUMENTS

| 4,381,201 A | * | 4/1983 | Sakurai | |
|---|---|---|---|---|
| 4,472,729 A | * | 9/1984 | Shibata et al. | |
| 4,489,478 A | * | 12/1984 | Sakurai | |
| 4,681,657 A | | 7/1987 | Hwang et al. | 156/657 |
| 4,753,709 A | | 6/1988 | Welch et al. | 156/643 |
| 4,807,016 A | | 2/1989 | Douglas | 357/67 |
| 4,818,335 A | | 4/1989 | Karnett | 156/644 |
| 4,966,865 A | | 10/1990 | Welch et al. | 437/192 |
| 5,037,777 A | | 8/1991 | Mele et al. | 437/195 |
| 5,084,417 A | | 1/1992 | Joshi | 437/192 |
| 5,150,276 A | | 9/1992 | Gonzalez | 361/313 |
| 5,252,517 A | | 10/1993 | Blalock | 437/195 |

(List continued on next page.)

FOREIGN PATENT DOCUMENTS

| EP | 0265584 | 4/1988 | |
|---|---|---|---|
| EP | 0 465 044 A2 | 6/1991 | .................... 21/90 |
| EP | 0 496 614 A1 | 1/1992 | |
| EP | 0 763 850 A1 | 8/1996 | .................. 21/311 |
| JP | 56-114355 | 9/1981 | |
| JP | 60-042821 | 3/1985 | |
| JP | 61-133666 | 6/1986 | |
| JP | 04-345054 | 12/1992 | |
| JP | 4-360570 | * 12/1992 | |
| JP | 5-335482 | * 12/1993 | |

OTHER PUBLICATIONS

Ikegami, et al. "Mechanisms of High PSG/SiO2 Selective Etching in a Highly Polymerized Fluorocarbon Plasma" Japanes Journal of Applied Physics, vol. 30, No. 7, Jul., 1991, pp. 1556–1561.

van den Hoek, et al, "Vacuum Surfaces, and Films", Journal of Vacuum Science & Technology A, Second Series, vol. 7, No. 3, Part 1, May/Jun. 1989, pp. 670–675.

*Primary Examiner*—Ngân V. Ngô
(74) *Attorney, Agent, or Firm*—Workman, Nydegger Seeley

(57) ABSTRACT

Disclosed is a semiconductor structure including a plurality of gate stacks that is fabricated by a process of using undoped silicon dioxide as an etch mask for selectively etching doped silicon dioxide. In one embodiment, a doped silicon dioxide layer is formed over a semiconductor substrate. An undoped silicon dioxide layer is formed and patterned over the doped silicon dioxide layer. Doped silicon dioxide is selectively removed from the doped silicon dioxide layer through the pattern by use of a plasma etch or another suitable etch that removes doped silicon dioxide at a rate greater than that of undoped silicon dioxide. The process may be used to form contacts to the semiconductor substrate. The process may also be used to form a structure with a lower and an upper series of parallel gate stacks, where the gate stacks have upper surfaces consisting essentially of undoped silicon dioxide.

20 Claims, 5 Drawing Sheets

U.S. PATENT DOCUMENTS

| | | | | |
|---|---|---|---|---|
| 5,286,344 A | | 2/1994 | Blalock et al. | 156/657 |
| 5,321,286 A | * | 6/1994 | Koyama et al. | 257/315 |
| 5,323,047 A | | 6/1994 | Nguyen et al. | 257/384 |
| 5,362,666 A | | 11/1994 | Dennison | 437/52 |
| 5,366,590 A | | 11/1994 | Kadomura | 156/662 |
| 5,374,332 A | | 12/1994 | Koyama et al. | 156/643 |
| 5,401,681 A | | 3/1995 | Dennison | 437/60 |
| 5,422,308 A | | 6/1995 | Nicholls et al. | 437/192 |
| 5,423,945 A | | 6/1995 | Marks et al. | 156/662.1 |
| 5,429,070 A | | 7/1995 | Campbell et al. | 118/723 R |
| 5,445,712 A | | 8/1995 | Yanagida | 156/662 |
| 5,485,035 A | | 1/1996 | Lin et al. | 257/637 |
| 5,611,888 A | | 3/1997 | Bosch et al. | 156/643.1 |
| 5,626,716 A | | 5/1997 | Bosch et al. | 438/723 |
| 5,643,819 A | | 7/1997 | Tseng | 437/60 |
| 5,677,227 A | | 10/1997 | Yang et al. | 437/60 |
| 5,685,951 A | | 11/1997 | Torek et al. | 156/646.1 |
| 5,700,731 A | | 12/1997 | Lin et al. | 438/381 |
| 5,712,202 A | | 1/1998 | Liaw et al. | 438/253 |
| 5,731,130 A | | 3/1998 | Tseng | 430/316 |
| 5,736,455 A | | 4/1998 | Iyer | 138/592 |
| 5,747,369 A | | 5/1998 | Kantimahanti et al. | 438/241 |
| 5,792,689 A | | 8/1998 | Yang et al. | 438/253 |
| 5,821,594 A | | 10/1998 | Kasai | 257/410 |
| 5,851,896 A | | 12/1998 | Summerfelt | 438/396 |
| 5,883,436 A | | 3/1999 | Sadjadi et al. | 257/760 |
| 5,897,352 A | | 4/1999 | Lin et al. | 438/255 |
| 5,918,120 A | | 6/1999 | Huang | 438/239 |
| 5,936,272 A | | 8/1999 | Lee | 257/306 |
| 5,986,299 A | | 11/1999 | Nakamura | 257/296 |
| 5,990,507 A | | 11/1999 | Mochizuki | 257/295 |
| 6,124,191 A | | 9/2000 | Bohr | 438/595 |
| 6,242,759 B1 | * | 6/2001 | Yamazaki et al. | 257/69 |
| 6,271,542 B1 | * | 8/2001 | Emma et al. | 257/67 |
| 6,277,758 B1 | | 8/2001 | Ko | 438/706 |

* cited by examiner

SEMICONDUCTOR STRUCTURE HAVING A PLURALITY OF GATE STACKS

RELATED APPLICATIONS

This is a divisional application of U.S. patent application Ser. No. 08/958,290, filed on Oct. 27, 1997, titled "Undoped Silicon Dioxide as Etch Mask for Patterning of Doped Silicon Dioxide", which is a Continuation-in-Part of U.S. patent application Ser. No. 08/846,671 entitled "Undoped Silicon Dioxide as Etch Stop for Selective Etch of Doped Silicon Dioxide," filed on Apr. 30, 1997, which both of which are incorporated herein by reference.

BACKGROUND OF THE INVENTION

1. The Field of the Invention

The present invention involves an etching process that utilizes an undoped silicon dioxide layer as an etch mask during a selective etch of a doped silicon dioxide layer that is situated on a semiconductor substrate. More particularly, the present invention relates to a process for depositing and patterning an undoped silicon dioxide layer over a doped silicon dioxide layer and conducting an etching process that is selective to undoped silicon dioxide, but not selective to doped silicon dioxide.

2. The Relevant Technology

Modern integrated circuits are manufactured by an elaborate process in which a large number of electronic semiconductor devices are integrally formed on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term doped silicon dioxide refers to a dopant concentration of at least 3 percent by weight of silicon dioxide. The term undoped silicon dioxide refers to a dopant concentration of less than 3 percent by weight of silicon dioxide.

Conventional semiconductor devices which are formed on a semiconductor substrate include capacitors, resistors, transistors, diodes, and the like. In advanced manufacturing of integrated circuits, hundreds of thousands of these semiconductor devices are formed on a single semiconductor substrate. In order to compactly form the semiconductor devices, the semiconductor devices are formed on varying levels of the semiconductor substrate. This requires forming a semiconductor substrate with a topographical design.

One common process for forming a topographical design on a semiconductor substrate involves etching of semiconductor material. Etching is typically conducted by depositing and patterning a layer of a masking material over the semiconductor material to be etched. The pattern formed on the layer of masking material defines a series of openings in the masking material and corresponds to the topographical design to be formed during the etching process. Next, an etching agent is applied to the semiconductor material through the pattern openings. In order to successfully form the topographical design, the etching agent must be selective to the masking material and not selective to the semiconductor material to be etched. In other words, the etching agent must remove a portion of the semiconductor material while leaving the masking material substantially intact.

Currently, photoresist material is commonly used as an etch mask. Use of photoresist material in an etch process involves depositing and patterning the photoresist material, applying an etching agent, and removing the photoresist material. Etching is performed using any of a number of processes known in the art, including gaseous, plasma and wet etch processes.

Sometimes double layers of photoresist material are required for forming topographical features. For example, a topographical structure design might call for successive etch processes on upper layers in a first region and a second region of the semiconductor material, then the bottom layers in the first region only. In such a case, a patterned photoresist layer is deposited (on the upper layer) with openings at both the first and second regions. The upper layers are first etched in the opening at the first and second regions. Next, a second patterned photoresist layer is positioned on the first layer. The second layer has openings only in the first region, but covers the second region. An etch agent then removes semiconductor materials of the bottom layers only in the first region. The second region is protected by photoresist so that the bottom layers in this second region will not be etched.

Each step required for forming topographical features on a semiconductor material makes the finished product more expensive to produce. Application and removal of photoresist material or other masking material as currently practiced in semiconductor device manufacturing adds expense and complexity to the process.

It is apparent that it would be advantageous to provide an etch mask that does not need to be removed after the etching process is finished. Additionally, it would be advantageous to provide an etching process that eliminates using two layers of photoresist material in situations where two are presently required. A process is also needed for etching semiconductor material located under existing topographical structures where traditional masking materials cannot be applied and removed or where it would be cumbersome to do so.

SUMMARY OF THE INVENTION

The present invention relates to a process for selectively etching a semiconductor material to form a designated topographical structure thereon utilizing an undoped silicon dioxide layer as an etch mask. In one embodiment, a doped silicon dioxide layer is formed over a semiconductor substrate. An undoped silicon dioxide layer is then formed and patterned over the doped silicon dioxide layer. The pattern on the undoped silicon dioxide layer comprises one or more openings, trenches, or other similar structures and exposes a portion of the doped silicon dioxide layer. The doped silicon dioxide layer is selectively removed through the pattern to form an opening, thereby creating a topographical structure using any etching agent that is selective to undoped silicon dioxide, but not selective to doped silicon dioxide. Preferably, a plasma etching process is used. The undoped silicon dioxide layer acts as an etch mask during the etching process. This embodiment provides the advantage that the undoped silicon dioxide layer does not need to be removed after the etching process is completed.

The process in this embodiment may be practiced with or without interleaving layers between the doped and undoped silicon dioxide layers. These interleaving layers may be any of a number of materials including a conductor material and a refractory metal silicide. Optionally, another undoped silicon dioxide layer may be positioned under the doped silicon dioxide layer to serve as an etch stop during etching.

In another embodiment of the present invention, an undoped silicon dioxide layer is used as an etch mask in combination with a photoresist layer for successive etching of a first and a second region on a doped silicon dioxide layer. In this embodiment, a doped silicon dioxide layer is formed over a semiconductor substrate. An undoped silicon dioxide layer is formed and patterned over the doped silicon dioxide layer to provide openings over both the first and second regions. Next, a photoresist layer is deposited over the undoped silicon dioxide layer. The photoresist layer is patterned to provide openings over the first region, while covering the second region.

In this embodiment, the doped silicon dioxide is etched in the first region. The etchant used is not selective to doped silicon dioxide, but is selective to undoped silicon dioxide and to photoresist material. Next, the photoresist layer is stripped, exposing the pattern openings over the second region. Finally, the second region is etched while the undoped silicon dioxide layer acts as an etch mask. This process provides the advantage of using only one layer of photoresist material instead of two as has conventionally been needed.

In still another embodiment of the invention, a lower series of gate stacks is formed over a semiconductor substrate. A doped silicon dioxide layer is deposited over the lower series of gate stacks. Next, an upper series of gate stacks is formed over the doped silicon dioxide layer. Each gate stack belonging to the upper series has a cap composed of substantially undoped silicon dioxide that defines the gate stack's top surface. Preferably, each gate stack belonging to the lower series also has a cap composed of substantially undoped silicon dioxide, but may have a cap of some other suitable material, such as silicon nitride.

The gate stacks have a multi-layer structure which may comprise a gate oxide situated over a silicon substrate; a polysilicon layer over the gate oxide; and a refractory metal silicide, preferably tungsten silicide, over the polysilicon and under the cap. The gate stacks also have spacers preferably made of substantially undoped silicon dioxide.

The gate stacks of the upper series are preferably aligned parallel to one another. The gate stacks of the lower series are also preferably in parallel alignment. The upper series of gate stacks may be aligned parallel to, orthogonal to, or otherwise in relation to the lower series of gate stacks.

This embodiment further involves applying an etchant to the doped silicon dioxide through spaces provided between the gate stacks. The etchant is not selective to doped silicon dioxide, but is selective to undoped silicon dioxide. The caps of the upper series of gate stacks therefore act as an etch mask in this embodiment. Likewise, if undoped silicon dioxide caps have been used on the lower series of gate stacks act, these caps act as an etch stop. Moreover, undoped silicon dioxide spacers of the upper and lower series of gate stacks may act as etch masks and etch stops, respectively. This embodiment provides the advantage of allowing the above-described structure to be formed where conventional etch mask materials could not be applied or where it would be especially difficult to do so.

The present invention contemplates novel structures formed by use of the inventive process. In particular, the process is used to form a lower series of parallel gate stacks overlaid by an upper series of gate stacks, each gate stack having an undoped silicon dioxide cap and undoped silicon dioxide spacers. In a preferred embodiment, the upper series of gate stacks is orthogonal to the lower series of gate stacks. The gate stacks of the upper series may serve as bit lines, while the gate stacks of the lower series may be word lines.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The inventive process described herein is directed towards selectively utilizing an etch system on a doped silicon dioxide ($SiO_2$) layer with a undoped silicon dioxide layer as an etch mask. One application of the inventive process is to form a self-aligned contact. The present invention also discloses an inventive multilayer gate structure.

Figure 1:
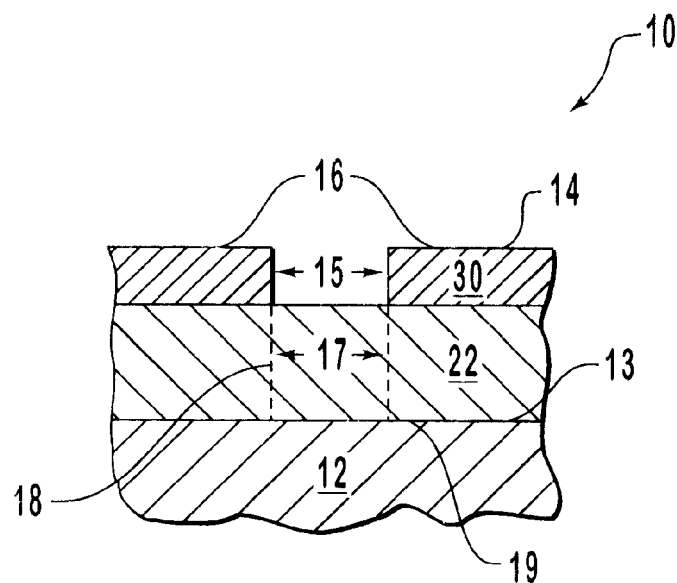
FIG. 1 is a partial cross-sectional elevation view of one embodiment of a multi-layer structure prior to an etch, the multi-layer structure including a silicon substrate, a doped silicon dioxide layer, and a patterned undoped silicon dioxide layer. The region of selective doped silicon dioxide removal is shown in phantom.

As illustrated in FIG. 1, one embodiment of a multilayer structure 10 is formed that comprises a semiconductor substrate 12. Semiconductor substrate 12 preferably comprises silicon. Overlying semiconductor substrate 12 is a doped silicon dioxide layer 22. Preferably, doped silicon dioxide layer 22 is substantially composed of borophosphosilicate glass (BPSG), borosilicate glass (PSG), or phosphosilicate glass (BSG). Most preferably, doped silicon dioxide layer 22 is substantially composed of silicon dioxide having doping of about 3% or more for boron by weight and about 3% or more for phosphorus by weight.

The next layer in the embodiment of multilayer structure 10 illustrated in FIG. 1 comprises an undoped silicon dioxide layer 30 having a base surface 13 and a mask surface 14. Undoped silicon dioxide layer 30 can be any type of undoped oxide and be formed by a thermal process, by a plasma enhanced deposition process, by conventional TEOS precursor deposition that is preferably rich in carbon or hydrogen, or by a precursor of gaseous silane ($SiH_4$) with oxygen. In the latter process, the gaseous silane flow will result in undoped silicon dioxide layer 30.

Undoped silicon dioxide layer 30 is processed to form a first selected pattern 15. After the patterning process is conducted, undoped silicon dioxide layer 30 defines an exposed etch mask surface 16 positioned adjacent to first selected pattern 15 above base surface 13.

The structure seen in FIG. 1 is now etched with a fluorinated or fluoro-carbon chemical etchant system to form second selected pattern 17 as indicated in phantom. The preferred manner is an anisotropic plasma etch of doped silicon dioxide layer 22 aligned with first selected pattern 15 down to the semiconductor substrate 12. An anisotropic plasma etch will form second selected pattern 17 having a profile substantially corresponding to that of first selected pattern 15. Moreover, first selected pattern 15 will be defined by a contact 19 situated on semiconductor substrate 12 and a wall 18 that is substantially orthogonal to semiconductor substrate 12. Exposed etch mask surface 16 prevents the etchant system from removing material from doped silicon dioxide layer 22 except as aligned with first selected pattern 15. Optionally, an etch stop layer (not shown) composed of substantially undoped silicon dioxide may be formed on semiconductor substrate 12.

The plasma etch technique employed herein is preferably generated under a closed chamber within the confines of a discharging unit and involves any type of a plasma system, including a high density plasma etcher. A conventional radio frequency reactive ion etcher (RF RIE) plasma system, a magnetically enhanced RIE (MERIE) plasma system, or an inductively coupled plasma system could be used. The preferred embodiment, however, is an RF type RIE or MERIE plasma system. The plasma system that is used preferably has a plasma density in a range from about $10^9/cm^3$ to about $10^{11}/cm^3$. A high density plasma system can also be used having a plasma density in a range from about $10^{11}/cm^3$ to about $10^{13}/cm^3$.

Figure 2:
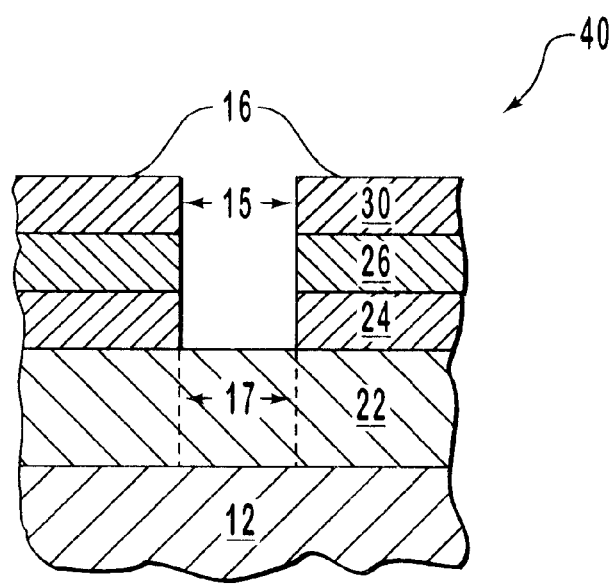
FIG. 2 is a partial cross-sectional elevation view of another embodiment of a multi-layer structure prior to an etch including a silicon substrate, layers of substantially doped silicon dioxide, polysilicon, tungsten silicide, and a patterned layer of substantially undoped silicon dioxide. The region of selective removal of doped silicon dioxide is shown in phantom.

Another embodiment of a multilayer structure 40 is seen in FIG. 2. Like multilayer structure 10 of FIG. 1, multilayer structure 40 has a doped silicon dioxide layer 22 and an undoped silicon dioxide layer 30 supported by semiconductor substrate 12. Additionally, this embodiment has two interleaving layers: a polysilicon layer 24 formed on doped silicon dioxide layer 22 and a refractory metal silicide layer 26 formed on the polysilicon layer 24. A refractory metal for purposes of the invention described herein includes titanium, chromium, tantalum, platinum, tungsten and zirconium, and also includes molybdenum. Preferably, refractory metal silicide layer 26 is substantially composed of tungsten silicide. As can be seen in FIG. 2, doped silicon dioxide layer 22, polysilicon layer 24, and refractory metal silicide layer 26 form a substrate assembly over which undoped silicon dioxide layer 30 can be formed.

The multilayer structure consisting of polysilicon layer 24, metal suicide layer 26 and undoped silicon dioxide 22 is processed to form first selected pattern 15 as described above in reference to FIG. 1. After the patterning process is conducted, undoped silicon dioxide layer 30 defines an exposed etch mask surface 16 positioned adjacent to first selected pattern 15.

The structure seen in FIG. 2 is next etched using an etching system as described above in reference to FIG. 1 to form second selected pattern 17 as indicated in phantom. The preferred manner is an anisotropic plasma etch of doped silicon dioxide layer 22 through first selected pattern 15 down to the semiconductor substrate 12. Exposed etch mask surface 16 prevents the etchant system from removing material from doped silicon dioxide layer 22 except through first selected pattern 15.

In a preferred embodiment of this invention, after second selected pattern 17 is formed in doped silicon dioxide layer 22, a conductive material (not shown) is formed in second selected pattern 17 to form a contact plug (not shown) for contacting semiconductor substrate 12. It may be desirable to line the contact hole of the contact plug with a refractory metal or a refractory metal silicide. As such, second selected pattern 17 would have proximate thereto a lining of a refractory metal or a silicide thereof prior to formation of the contact plug in contact with semiconductor substrate 12.

Figure 3:
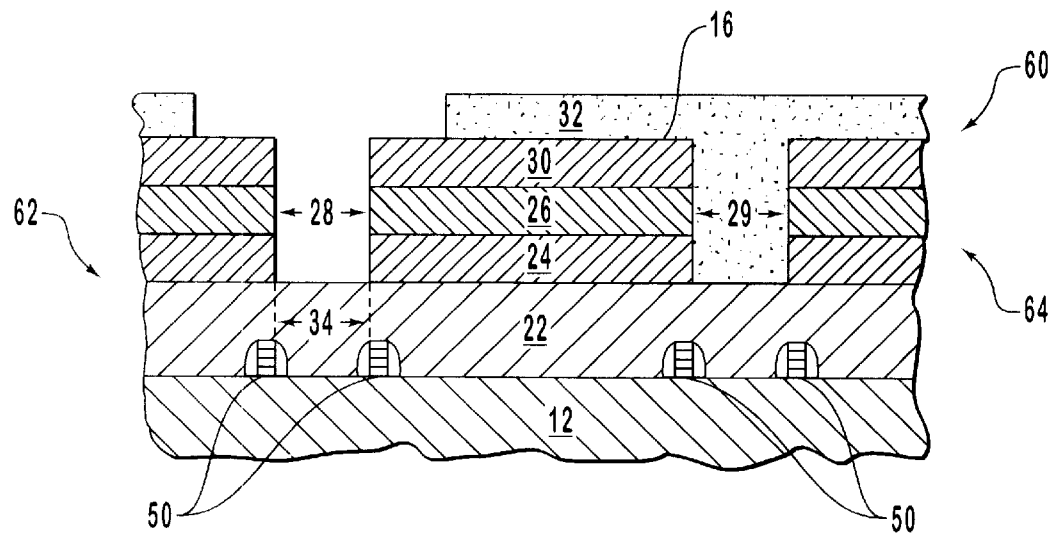
FIG. 3 is a partial cross-sectional elevation view of another embodiment of a multi-layer structure prior to etch. The structure includes a series of gate stacks positioned on a silicon substrate, a layer of substantially doped silicon dioxide, and patterned structures consisting of layers of polysilicon, tungsten silicide, and substantially undoped silicon dioxide. A patterned layer of photoresist material is formed on the layer of substantially undoped silicon dioxide and fills the pattern in the undoped silicon dioxide in the second region. The selective removal of doped silicon dioxide in the first region is shown in phantom on the left side of FIG. 3.

Another embodiment of the inventive process is seen in FIG. 3. A multilayer structure 60 is formed in this embodiment. Multilayer structure 60 has a primary region indicated generally at 62 and a secondary region indicated generally at 64. Multilayer structure 60 comprises a series of gate stacks 50 formed on a semiconductor substrate 12. A doped silicon dioxide layer 22 is formed over the gate stacks 50 and supported by semiconductor substrate 12. This embodiment also includes a polysilicon layer 24, a refractory metal silicide layer 26, and an undoped silicon dioxide layer 30.

The upper multilayer structure consisting of the polysilicon layer 24, metal silicide layer 26, and the undoped silicon dioxide layer 30 is processed to form first selected pattern comprising a primary opening 28 located in primary region 62 and a secondary opening 29 located in secondary region 64. The patterning process is conducted as described above in reference to FIG. 1.

A photoresist material layer 32 is then formed on undoped silicon dioxide layer 30, substantially filling secondary opening 29 and exposing primary opening 28. The resist pattern is such that the alignment with primary opening 28 is not critical. Multilayer structure 60 is etched using any suitable etching system that is selective to both photoresist material layer 32 and to undoped silicon dioxide layer 30 but not selective to substantially doped silicon dioxide in doped silicon dioxide layer 22. Substantially doped silicon dioxide is etched through the primary opening 28 of the first selected pattern. The preferred manner is an anisotropic etch of doped silicon dioxide layer 22 down past gate stacks 50 to semiconductor substrate 12 so as to create a primary etched pattern 34 indicated in phantom. In this etch, undoped silicon dioxide layer 30 acts as an etch mask in region 28.

Figure 4:
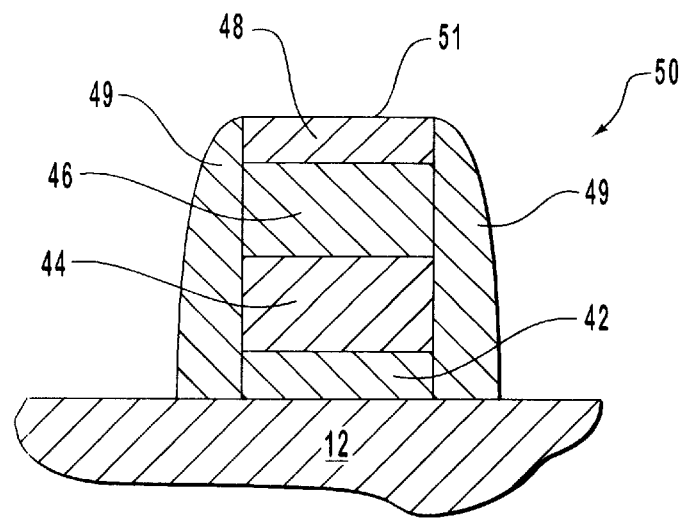
FIG. 4 is a partial cross-sectional view of a gate stack such as is seen in FIG. 3. The gate stack has successive layers of gate oxide, polysilicon, tungsten silicide, and substantially undoped silicon dioxide supported by a silicon substrate. The gate stack also has lateral undoped silicon dioxide spacers.

FIG. 4 illustrates a preferred embodiment of a gate stack, such as gate stacks 50 of FIG. 3. Gate stack 50 has a gate oxide layer 42 supported by semiconductor substrate 12. Gate oxide layer 42 may be relatively thin in comparison with other layers of gate stack 50. The next layer comprises a polysilicon gate layer 44. A refractory metal silicide layer 46 is formed on polysilicon gate layer 44. A known benefit of refractory metal suicides is low resistivity. Preferably, refractory metal silicide layer 46 is substantially composed of tungsten silicide ($WSi_x$).

Overlying refractory metal silicide layer 46 is an undoped silicon dioxide layer 48 which can be formed thermally, by plasma enhanced deposition, by a conventional TEOS precursor deposition that is preferably rich in carbon or hydrogen, or by a precursor of gaseous silane ($SiH_4$) with oxygen. Undoped silicon dioxide layer 48 is commonly referred to as a cap, and defines a distal surface 51 in relation to the semiconductor substrate 12. Additionally, a spacer 49 is formed on both a lateral side of each gate stack 50 such that each spacer 49 contacts gate oxide layer 42, polysilicon gate layer 44, refractory metal silicide layer 46, and undoped silicon dioxide layer 48. Preferably, spacer 49 is substantially composed of substantially undoped silicon dioxide. Alternatively, spacers 49 can be substantially composed of another suitable material, including silicon nitride.

Figure 5:
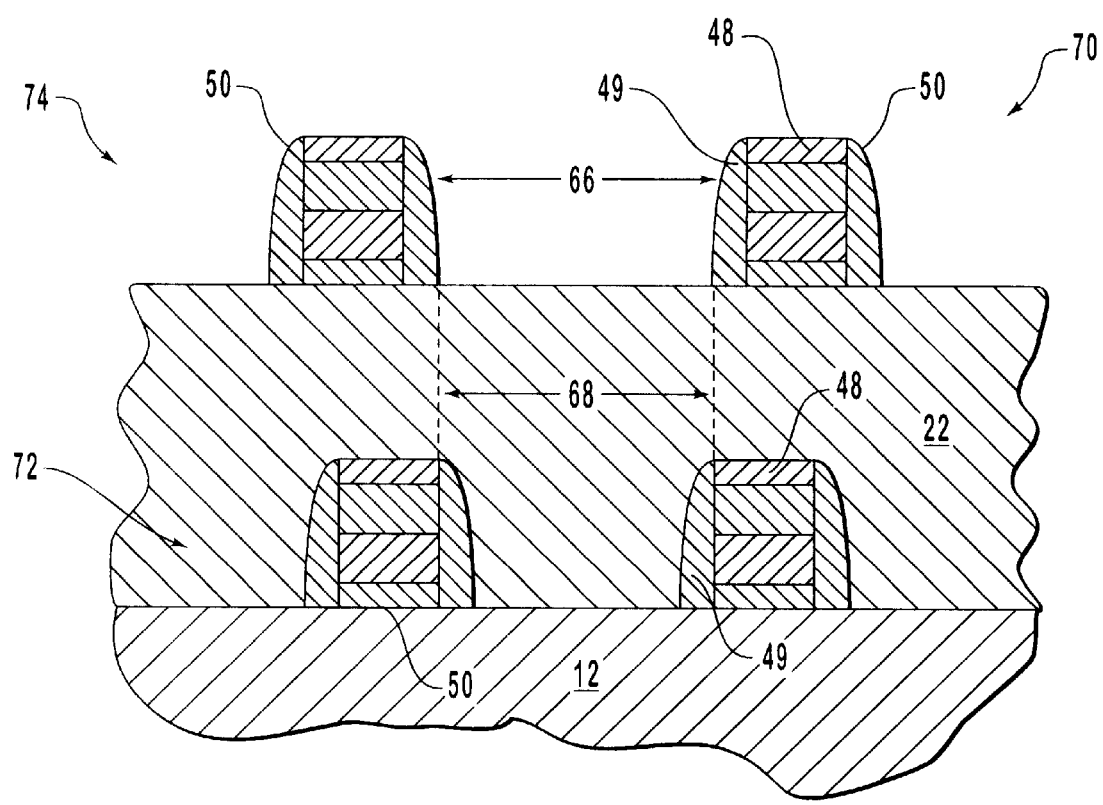
FIG. 5 is a partial cross-sectional elevation view of a first and second layer of gate stacks before substantially doped silicon dioxide has been selectively removed. The portion of the substantially doped silicon dioxide to be removed is indicated in phantom. In this embodiment the gate stacks of the first layer are parallel to those of the second layer.

FIG. 5 illustrates another embodiment of a multilayer structure 70 formed by the inventive process. Multilayer structure 70 comprises a first series of substantially parallel gate stacks 50 indicated generally at 72 formed on semiconductor substrate 12. A doped silicon dioxide layer 22 is positioned on first series 72 and is supported by the semiconductor substrate 12. A second series of substantially parallel gate stacks 50 indicated generally at 74 is supported by doped silicon dioxide layer 22. In FIG. 5, each gate stack 50 of first series 72 has a longitudinal axis extending into the page that defines a directional component of first series 72. Likewise, each gate stack 50 of second series 74 has a longitudinal axis extending into the page that defines a directional component of second series 74. In the embodiment illustrated in FIG. 5, the directional component of first series 72 is parallel to the directional component of second series 74. Alternatively, first and second series 72, 74 may be aligned in some other manner, including but not limited to being positioned such that the respective directional components thereof are orthogonal with respect to each other.

Gate stacks 50 of second series 74 define a first selected pattern 66 having a series of elongated openings between gate stacks 50 of second series 74. Multilayer structure 70 is next etched using an etching system as described above in reference to FIG. 1 to form a second selected pattern 68 as indicated in phantom. The preferred manner is an anisotropic plasma etch of doped silicon dioxide layer 22 through first selected pattern 66 down to the semiconductor substrate 12. Undoped silicon dioxide layer 48 on each gate stacks 50 of second series 74 acts as an etch mask, thereby preventing the etchant system from removing material from doped silicon dioxide layer 22 except as aligned with first selected pattern 66. If spacers 49 of second series 74 are substantially composed of substantially undoped silicon dioxide, they will act as an etch mask. Preferably, undoped silicon dioxide layer 48 and spacers 49 of the first series 72 act as an etch stop surface, thereby preventing the etching system from substantially removing material from first series 72. Alternatively, the silicon dioxide of spacers 49 in gate stacks 50 of first series 72 can be composed of some other suitable material, such as silicon nitride.

Figure 8:
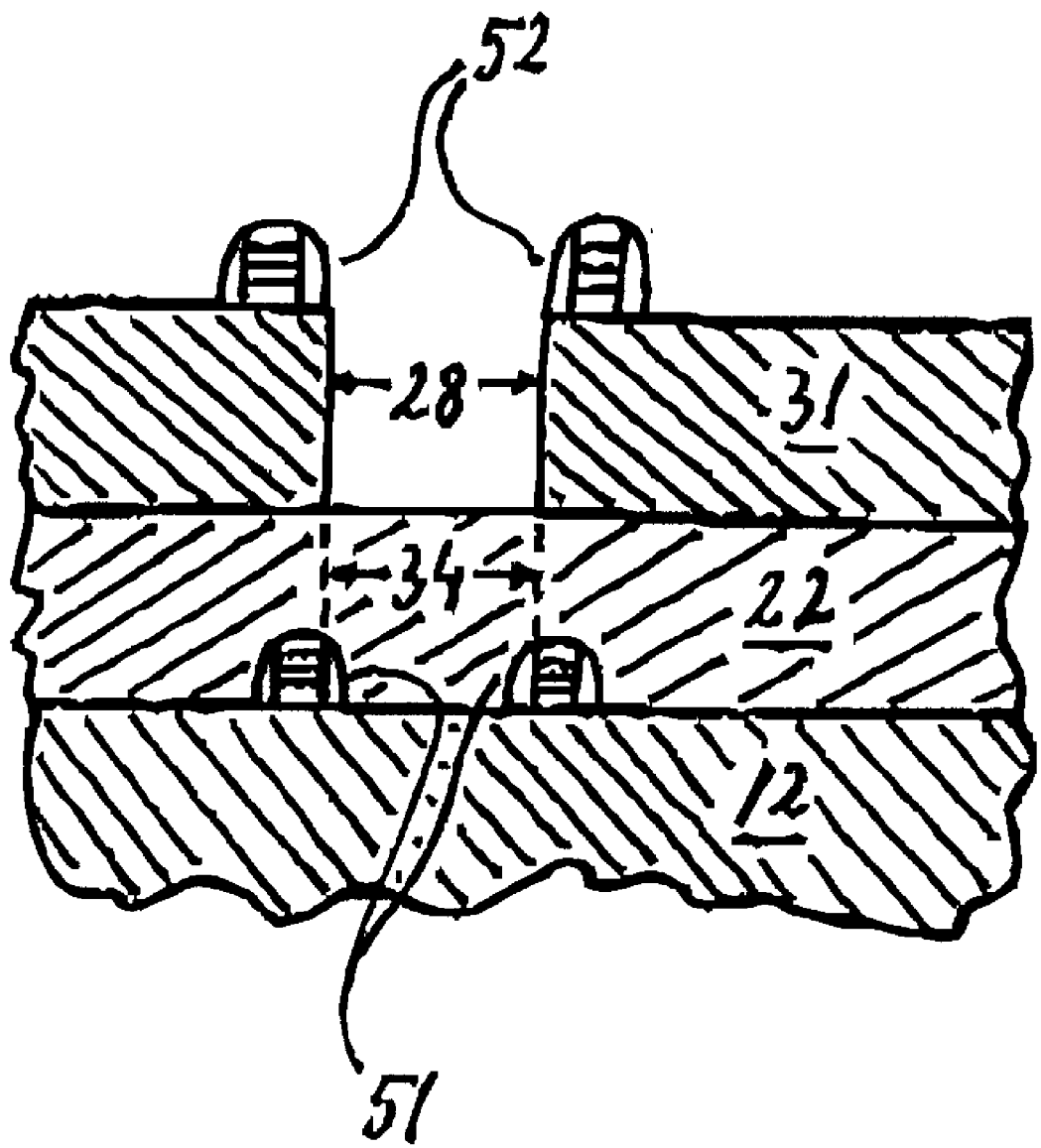
FIG. 8 is a cross-sectional elevation view of a multi-layer structure prior to etch as depicted in FIG. 3, with an additional series of gate stacks.

As schematically shown in FIG. 8, an embodiment analogous to that shown in FIG. 5 is depicted with at least one interleaving layer 31 and two series of gate stacks 51 and 52. Layer 31 in FIG. 8 represents at least one of the interleaving layers 24, 26 and 30 shown in FIGS. 2–3. Common numerals with FIG. 3 denote analogous features.

Figure 6:
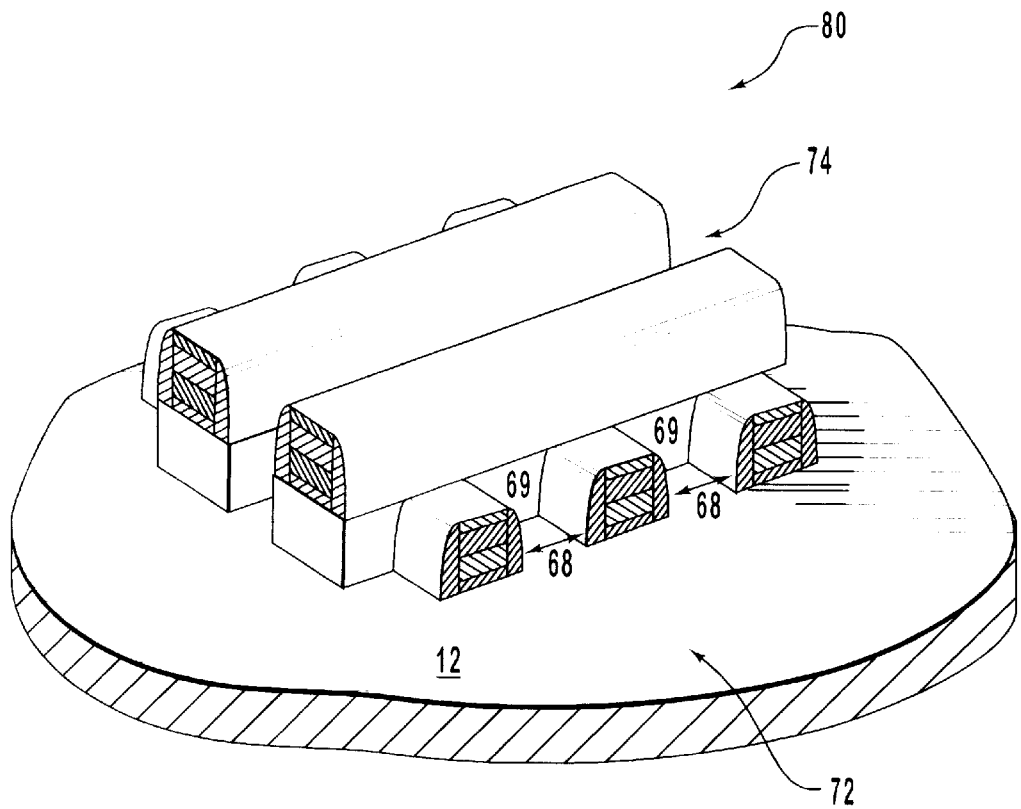
FIG. 6 is a perspective view of an embodiment of a structure formed after substantially doped silicon dioxide is etched. The structure has a first layer of gate stacks supported by a silicon substrate. The gates stacks in the first layer are parallel one with another. The structure also has a second layer of gate stacks supported by the first layer and by substantially doped silicon dioxide that remains after the etching process is conducted. The gate stacks of the second layer are likewise parallel one with another. The individual gate stacks of the first layer are oriented orthogonal to the gate stacks of the second layer in this embodiment.

FIG. 6 illustrates a partial perspective view of an inventive multilayer structure 80 formed by practicing the inventive process. Multilayer structure 80 is similar to multilayer structure 70 of FIG. 5 other than the variation in the directional components of first series 72 and second series 74. In multilayer structure 80, the directional component of second series 74 is orthogonal to the directional component of first series 72. Second series 74 is supported by first series 72. Additionally, a residual doped silicon dioxide material 69 is seen in locations where doped silicon dioxide layer 22 was not etched.

Figure 7:
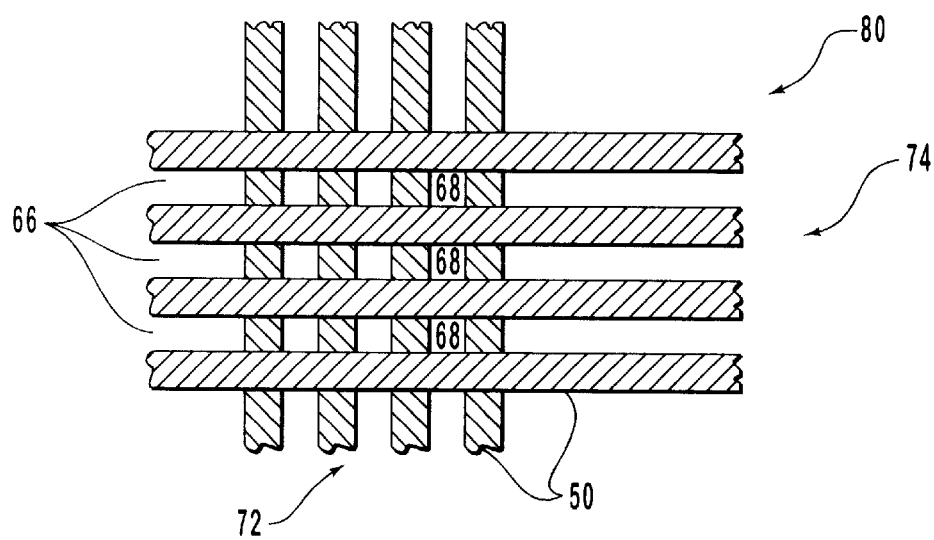
FIG. 7 is a top view of the structure seen in FIG. 6. This view illustrates openings that are rectangular in cross section, are situated between the first and second layers of gate stacks, and that represent portions of a doped silicon dioxide layer that have been selectively removed during an etching process.

FIG. 7 illustrates a top view of FIG. 6 and shows the configuration and elongated openings of first selected pattern 66. In a preferred embodiment of the invention, first series 72 function as word lines and second series 74 function as bit lines.

Regarding the etching system used according to this invention, one factor that effects the etch rate and the etch selectivity of the process is pressure. The total pressure has a preferred range from about 1 millitorr to about 400 millitorr. A more preferred pressure range for a plasma etch is in a pressure range from about 1 millitorr to about 100 millitorr. The most preferred pressure range for a plasma etch is from about 1 millitorr to about 75 millitorr. The pressure may be increased, however, above the most preferred ranges. For example, the RIE etch may be performed at about 100 millitorr. Selectivity can be optimized at a pressure range between about 10 millitorr and about 75 millitorr. Pressure increases may result in a loss in selectivity. The range in selectivity, however, can be adjusted to accommodate different pressures. As such, selectivity and pressure are inversely related.

Temperature is another factor that effects the selectivity of the etching process used. A preferable temperature range of the reactor cathode during the plasma etch has a range of about 10° C. to about 80° C., and more preferably about 20° C. to about 40° C. This is the temperature of a bottom electrode adjacent to semiconductor substrate 12 during the etching process. The preferable range of the semiconductor materials is between about 40° C. and about 130° C., and more preferably between about 40° C. and about 90° C.

Undoped silicon dioxide layer 30 seen in FIGS. 2 and 3 protects underlying substantially doped silicon dioxide from the fluorinated chemical etch. As illustrated in FIG. 2, the etch will anisotropically remove a portion of doped silicon dioxide layer 22 that is aligned with first selected pattern 15 as indicated by second selected pattern 17. The etch removes material from doped silicon dioxide layer 22 at a higher material removal rate than that of undoped silicon dioxide layer 30. Preferably, the etch has a material removal rate for substantially doped silicon dioxide that is at least 10 times higher than that of substantially undoped silicon dioxide.

Preferably, etching as conducted according to this invention involves an anisotropic plasma etch with a fluorinated chemistry that etches through BSG, PSG, BPSG, or doped silicon dioxide in general. The etch is preferably selective to undoped silicon dioxide, silicon, and silicon nitride. The fluorinated chemical etch utilizes a type of carbon fluorine gas that is preferably selected from the group of $C_2F_6$, $CF_4$, $C_3F_8$, $C_4F_{10}$, $C_2F_8$, $CH_2F_2$, $CHF_3$, $C_2HF_5$, $CH_3F$ and combinations thereof. There are other fluorinated etchants in a substantially gas phase that can be employed during the etching of the structure. An inert gas is often used in combination with the fluorinated etchant. Argon, nitrogen, and helium are examples of such an inert gas. The preferred gasses, however, are $CF_4$, $CH_2F_2$, $CHF_3$ and Ar. Alternatively $CH_3F$ may be used in place of $CH_2F_2$. In particular, the preferred enchant is a fluorine deficient gas which is defined as a gas where there are not enough fluorine atoms to saturate the bonding for the carbon atoms.

The present invention has application to a wide variety of structures. Undoped silicon dioxide layers can be used to create and protect various types of structures during the doped silicon dioxide etching process for structures other than those specifically described herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor structure supported by a substrate, said structure comprising:
   a first series supported by a substrate, said first series comprising:
      a plurality of substantially parallel gate stacks, said gate stacks of said first series having a longitudinal axis defining a directional component of said first series, wherein at least one of said plurality of gate stacks of said first series comprises a gate oxide layer, a polysilicon gate layer on and in contact with said gate oxide layer, a refractory metal silicide layer on and in contact with said polysilicon gate layer, an undoped silicon dioxide layer having a top surface and a bottom surface, the bottom surface being on and in contact with said refractory metal silicide layer, a spacer extending from said gate oxide layer to said top surface, and said spacer being in contact with said gate oxide layer, said polysilicon layer, said refractory metal silicide layer, and said undoped silicon dioxide cap layer; and
   a second series supported by said first series, said second series comprising:
      a plurality of substantially parallel gate stacks, said gate stacks of said second series having a longitudinal axis defining a directional component of said second series, wherein at least one of said plurality of gate stacks of said second series comprises a second gate oxide layer, a second polysilicon gate layer on and in contact with said second gate oxide layer, a second refractory metal silicide layer on and in contact with said second polysilicon gate layer, a second undoped silicon dioxide layer having a top surface and a bottom surface, the bottom surface of said second undoped silicon dioxide layer being on and in contact with said second refractory metal silicide layer, a second spacer extending from said second gate oxide layer to said top surface of said second undoped silicon dioxide layer, and said second spacer being in contact with said second gate oxide layer, said second polysilicon layer, said second refractory metal suicide layer, and said second undoped silicon dioxide cap layer.

2. A structure as recited in claim 1, wherein said directional component of said first series is substantially parallel with said directional component of said second series.

3. A structure as recited in claim 1, wherein said directional component of said first series is substantially orthogonal to said directional component of said second series.

4. A structure as recited in claim 1, wherein a doped silicon dioxide layer extends over said first series of gate stacks, and wherein the second series of gate stacks are supported by said doped silicon dioxide layer.

5. A semiconductor structure supported by a substrate, said structure comprising:
   a first series supported by said substrate, said first series comprising:
      a plurality of substantially parallel gate stacks, said gate stacks of said first series having a longitudinal axis defining a directional component of said first series, a refractory metal silicide interleaving layer over said first series of gate stacks; and
   a second series comprising:
      a plurality of substantially parallel gate stacks, said gate stacks of said second series having a longitudinal axis defining a directional component of said second series, each said gate stack of said second series having an undoped silicon dioxide layer defining a distal surface in relation to said substrate, wherein the second series of gate stacks:
      are supported by said refractory metal silicide interleaving layer; and
      define at least one space between any two adjacent gate stacks of said second series, each said gate stack of said second series including a spacer in contact with said undoped silicon dioxide layer, said spacer defining a lateral surface on each said gate stack of said second series.

6. A structure as recited in claim 5, wherein said directional component of said first series is substantially parallel with said directional component of said second series.

7. A structure as recited in claim 5, wherein said directional component of said first series is substantially orthogonal to said directional component of said second series.

8. The semiconductor structure as recited in claim 5, wherein said refractory metal silicide interleaving layer comprises a material selected from the group consisting of silicides of molybdenum, chromium, tungsten, titanium, tantalum, platinum, and zirconium.

9. A semiconductor structure supported by a substrate, said structure comprising:
   a first series of gate stacks positioned parallel one with another, said first series supported by a substrate, said gate stacks of said first series having a longitudinal axis that defines a directional component of said first series, each said gate stack comprising:
      a gate oxide layer supported by a substrate;
      a polysilicon layer on said gate oxide layer;
      a refractory metal silicide layer on said polysilicon layer;
      an undoped silicon dioxide layer on said refractory metal silicide layer and defining a distal surface in relation to said substrate; and a spacer consisting essentially of undoped silicon dioxide, said spacer being in contact with said gate oxide layer, said polysilicon layer, said refractory metal silicide layer, and said undoped silicon dioxide layer;

an interleaving layer consisting essentially of doped silicon dioxide that is doped with at least one of boron and phosphorus, said doped silicon dioxide layer being formed on said first series of substantially parallel gate stacks;

a second series of said gate stacks positioned substantially parallel one with another, said gate stacks of said second series having a longitudinal axis that defines a directional component of said second series, at least one opening being formed between said gate stacks of said second series, said at least one opening being defined by any two adjacent gate stacks of said second series, said second series supported by said first series; and a selected pattern in said doped silicon dioxide through said interleaving layer and through said at least one opening between said gate stacks of said second series.

10. The semiconductor structure as recited in claim 9, wherein said refractory metal silicide layer of each said gate stack comprises tungsten silicide.

11. The semiconductor structure as recited in claim 9, wherein said directional component of said first series is substantially parallel to said directional component of said second series.

12. The semiconductor structure as recited in claim 9, wherein said directional component of said first series is substantially orthogonal to said directional component of said second series.

13. A semiconductor structure supported by a substrate, said structure comprising:

a first series of gate stacks positioned parallel one with another, said first series supported by a substrate, said gate stacks of said first series having a longitudinal axis that defines a directional component of said first series, each said gate stack comprising:
  a gate oxide layer supported by a substrate;
  a polysilicon layer on said gate oxide layer;
  a refractory metal silicide layer on said polysilicon layer;
  an undoped silicon dioxide layer on said refractory metal silicide layer and defining a distal surface in relation to said substrate; and a spacer consisting essentially of undoped silicon dioxide, said spacer being in contact with said gate oxide layer, said polysilicon layer, said refractory metal silicide layer, and said undoped silicon dioxide layer;

an electrically conductive interleaving layer and being formed on said first series of substantially parallel gate stacks;

a second series of said gate stacks positioned substantially parallel one with another, said gate stacks of said second series having a longitudinal axis that defines a directional component of said second series, at least one opening being formed between said gate stacks of said second series, said at least one opening being defined by any two adjacent gate stacks of said second series, said second series supported by said first series.

14. The semiconductor structure as recited in claim 13, wherein said electrically conductive interleaving layer comprises a material selected from the group consisting of silicides of molybdenum, chromium, tungsten, titanium, tantalum, platinum, and zirconium.

15. The semiconductor structure as recited in claim 13, wherein said electrically conductive interleaving layer comprises polysilicon.

16. The semiconductor structure as recited in claim 13, wherein said electrically conductive interleaving layer comprises:
  a layer of polysilicon; and
  a layer of refractory metal silicide.

17. A structure as recited in claim 1, wherein each of said plurality of gate stacks of said first series comprises one said gate oxide layer, each of said plurality of gate stacks of said second series comprises one of said second undoped silicon dioxide layer, and wherein said gate oxide layers of said gate stacks of said first series is in contact with said second undoped silicon dioxide layers of said second series.

18. A structure as recited in claim 1, wherein each of said spacers and each of said second spacers comprise the same material.

19. A structure as recited in claim 18, wherein said material comprises undoped silicon dioxide.

20. A structure as recited in claim 1, wherein each of said spacers comprises silicon nitride and of said second spacers comprises undoped silicon dioxide.

* * * * *

UNITED STATES PATENT AND TRADEMARK OFFICE
CERTIFICATE OF CORRECTION

PATENT NO.    : 6,479,864 B1
DATED         : November 12, 2002
INVENTOR(S)   : Kei-Yu Ko It is certified that error appears in the above-identified patent and that said Letters Patent is hereby corrected as shown below:

<u>Title page,</u>
Item [56], References Cited, U.S. PATENT DOCUMENTS, insert the following patents:
-- 5,192,703    3/93     Lee et al. …………..438/396
5,792,703       8/98     Bonner et al. ….......438/620
5,478,772       12/95    Fazen ……………..148/DIG.14
5,312,768       5/94     Gonzalez …………..438/227
5,550,071       8/96     Ryou ……………….438/305
5,731,242       3/98     Parat et al. ………….438/211
5,208,176       5/93     Ahmad et al. ……….257/499
5,210,047       5/93     Woo et al. ………….148/DIG.19
5,482,894       1/96     Havermann ………...438/623
5,063,169       11/91    De Bruin et al. ……..148/DIG.26 --

<u>Column 1,</u>
Line 11, delete "which"

<u>Column 5,</u>
Line 19, change "PSG" to -- BSG --
Line 20, change "BSG" to -- PSG --

<u>Column 6,</u>
Line 20, change "suicide" to -- silicide --

<u>Column 7,</u>
Line 18, change "suicides" to -- silicides --

<u>Column 9,</u>
Line 53, delete "cap"

UNITED STATES PATENT AND TRADEMARK OFFICE
CERTIFICATE OF CORRECTION

PATENT NO. : 6,479,864 B1
DATED : November 12, 2002
INVENTOR(S) : Kei-Yu Ko

It is certified that error appears in the above-identified patent and that said Letters Patent is hereby corrected as shown below:

Column 10,
Line 7, change "suicide" to -- silicide --
Line 8, delete "cap"

Signed and Sealed this

Eighth Day of July, 2003

JAMES E. ROGAN
*Director of the United States Patent and Trademark Office*